(12) United States Patent
Blattner et al.

(10) Patent No.: US 7,682,455 B2
(45) Date of Patent: Mar. 23, 2010

(54) DEVICE FOR STORING AND/OR TRANSPORTING PLATE-SHAPED SUBSTRATES IN THE MANUFACTURE OF ELECTRONIC COMPONENTS

(75) Inventors: Jakob Blattner, Ermatingen (CH); Rudy Federici, Berg (CH)

(73) Assignee: Tec-Sem AG, Tägerwilen (CH)

( * ) Notice: Subject to any disclaimer, the term of this patent is extended or adjusted under 35 U.S.C. 154(b) by 0 days.

(21) Appl. No.: 10/564,066

(22) PCT Filed: Jul. 8, 2004

(86) PCT No.: PCT/CH2004/000428

§ 371 (c)(1), (2), (4) Date: Jan. 10, 2006

(87) PCT Pub. No.: WO2005/006407

PCT Pub. Date: Jan. 20, 2005

(65) Prior Publication Data

US 2006/0151404 A1    Jul. 13, 2006

(30) Foreign Application Priority Data

Jul. 11, 2003  (CH) .................................. 1219/03
Feb. 16, 2004  (CH) .................................. 237/04

(51) Int. Cl.
*C23C 16/00* (2006.01)
*C23F 1/00* (2006.01)
*H01L 21/306* (2006.01)
*B65G 57/00* (2006.01)
*B65H 29/00* (2006.01)
*B65H 31/00* (2006.01)
*B65H 3/00* (2006.01)
*B65G 59/02* (2006.01)
*B65G 59/00* (2006.01)

(52) U.S. Cl. ................ 118/728; 118/719; 118/729; 118/730; 156/345.31; 156/345.32; 414/789.5; 414/790.2; 414/796.9; 414/797.8; 414/798.9

(58) Field of Classification Search .............. 414/935, 414/789.5, 790.2, 797.8, 798.9; 206/832
See application file for complete search history.

(56) References Cited

U.S. PATENT DOCUMENTS 4,055,258 A * 10/1977 Schneider .................. 414/796

(Continued)

FOREIGN PATENT DOCUMENTS

JP    2001291759 A  * 10/2001

(Continued)

*Primary Examiner*—Parviz Hassanzadeh
*Assistant Examiner*—Rakesh Dhingra
(74) *Attorney, Agent, or Firm*—McGlew and Tuttle, P.C.

(57) ABSTRACT

To make possible a tightly packed, essentially horizontal storage of wafers (40), in which a simplified access to each of these wafers (40) is possible, a device is provided having a plurality of superimposed storage elements (10). The storage elements (10) have device features (16) for depositing the wafers (40). The storage elements (10) have projections (14) for lifting, whereby a specific storage element (10a) as well as all storage elements (10) arranged above this specific storage element (10a) can be lifted by a predetermined first height for producing a contact gap. The projections (14) can also be used to lift the storage element (10b) arranged below the said storage element (10a) by a predetermined second height for producing a freedom of access.

22 Claims, 11 Drawing Sheets

U.S. PATENT DOCUMENTS

| | | | |
|---|---|---|---|
| 4,909,412 A * | 3/1990 | Cerf | 221/1 |
| 4,966,519 A * | 10/1990 | Davis et al. | 414/805 |
| 5,112,641 A * | 5/1992 | Harada et al. | 438/542 |
| 5,534,074 A | 7/1996 | Koons | |
| 5,752,609 A * | 5/1998 | Kato et al. | 211/41.18 |
| 6,141,314 A * | 10/2000 | Umesaki et al. | 369/30.92 |
| 6,238,283 B1 * | 5/2001 | Matsuyama et al. | 454/187 |
| 2002/0002946 A1* | 1/2002 | Tanaka et al. | 118/719 |
| 2002/0018703 A1* | 2/2002 | Kyouno | 414/222.01 |
| 2002/0125170 A1* | 9/2002 | Nyseth et al. | 206/711 |
| 2002/0179863 A1* | 12/2002 | Harris et al. | 250/559.4 |

FOREIGN PATENT DOCUMENTS

| | | |
|---|---|---|
| JP | 2002 110577 | 4/2002 |
| JP | 2003 188243 | 7/2003 |
| WO | WO 97/20341 | 6/1997 |

\* cited by examiner

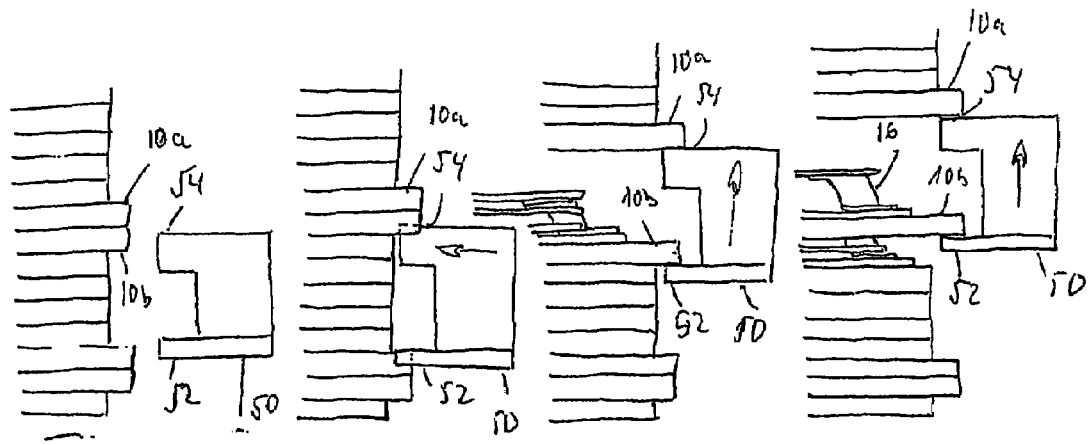
Fig. 5a  Fig. 5b  Fig. 5c  Fig. 5d
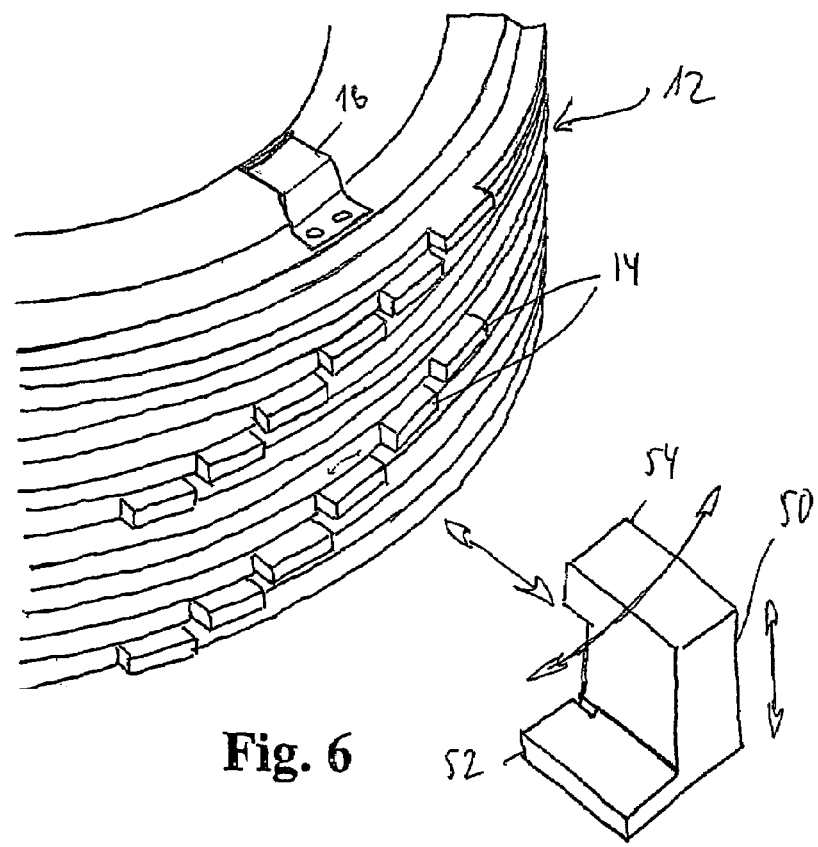
Fig. 6

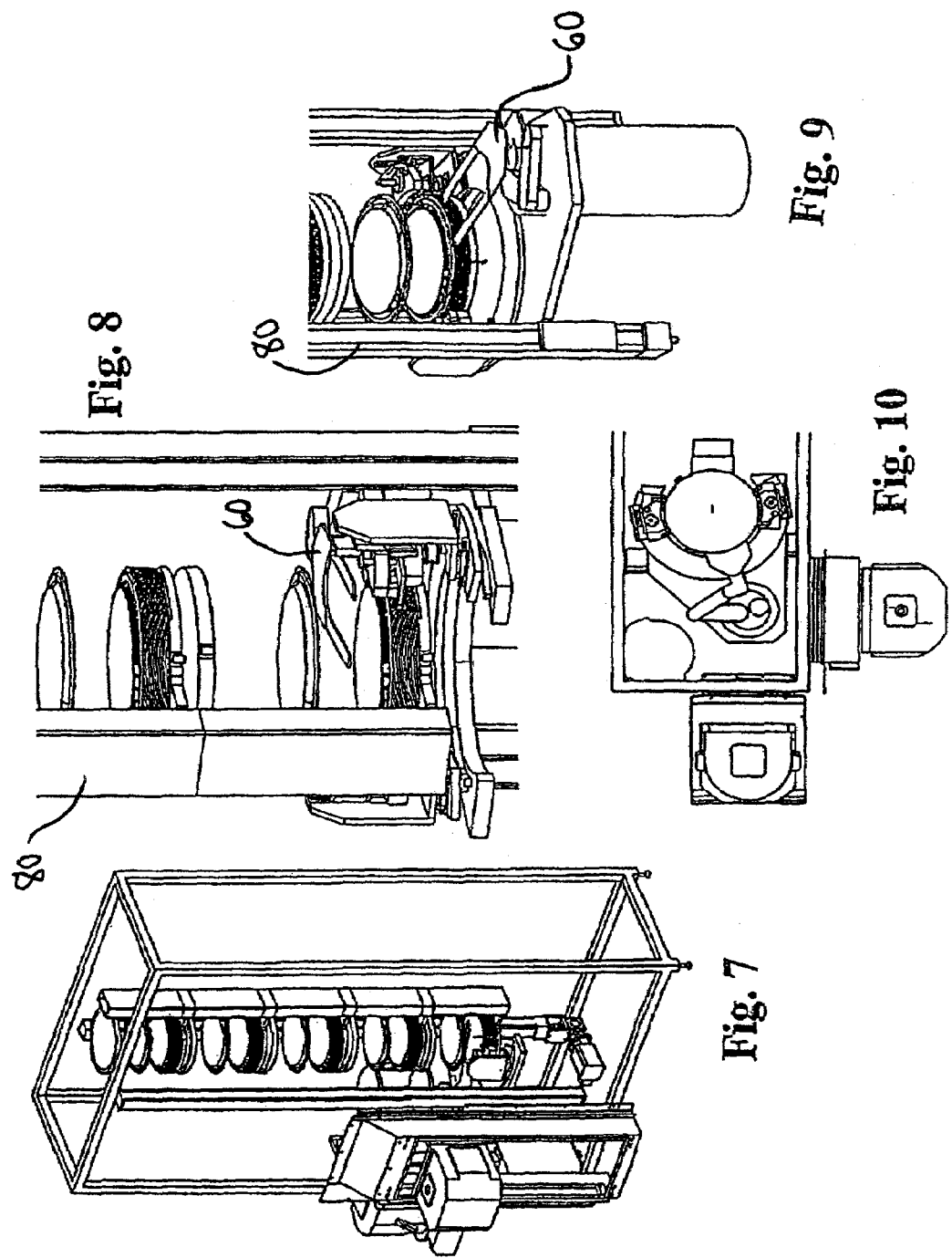

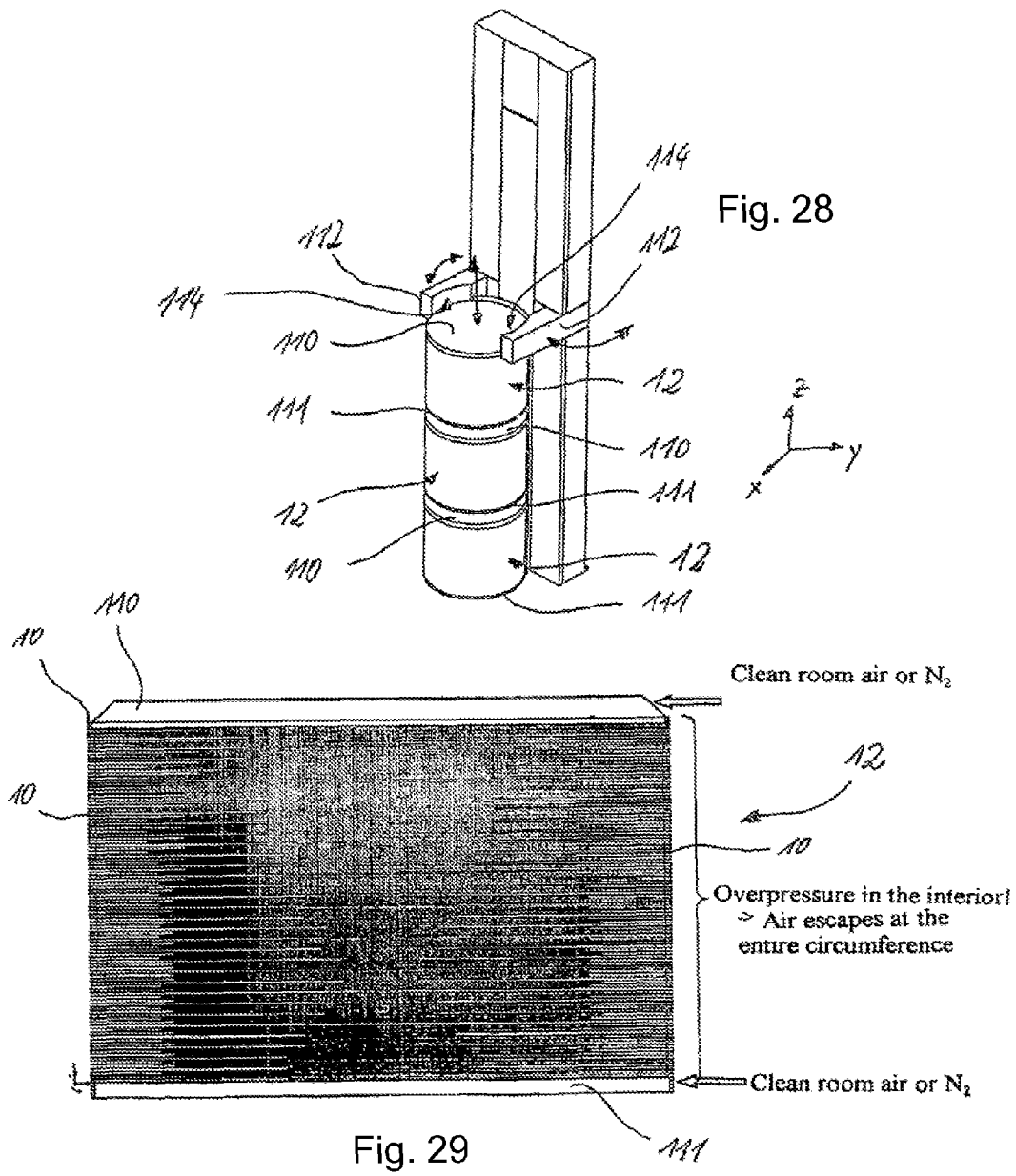

DEVICE FOR STORING AND/OR TRANSPORTING PLATE-SHAPED SUBSTRATES IN THE MANUFACTURE OF ELECTRONIC COMPONENTS

CROSS REFERENCE TO RELATED APPLICATIONS

This application is a United States National Phase application of International Application PCT/CH2004/000428 filed Jul. 8, 2004 and claims the benefit of priority under 35 U.S.C. § 119 of Swiss Patent Application CH 1219/03 filed Jul. 11, 2003 and Swiss Patent Application CH 237/04 filed Feb. 16, 2004, the entire contents of which are incorporated herein by reference.

FIELD OF THE INVENTION

The present invention pertains to a device for storing plate-shaped, and in particular disk-shaped, substrates as they are usual in the manufacture of electronic components. Substrates of this type may especially be so-called wafers or test wafers. In particular, a plurality of substrates may preferably be stored horizontally with a devices according to the present invention. Moreover, the present invention pertains to a method for handling such substrates in connection with their storage.

BACKGROUND OF THE INVENTION

Electronic components are usually produced from approximately circular semiconductor disks, so-called wafers. These substrates must be fed to various processing plants, in which the substrates are essentially surface-treated. In this connection, it is often necessary to store the substrates temporarily, if, after completion of the processing in a processing plant, the substrates cannot be fed immediately thereafter to another processing plant. It is common to store the substrates temporarily in a storage device under clean or ultraclean room conditions (all in all, called "clean room conditions" below). Since the costs for producing the clean room conditions essentially depend on the size of the room, an effort is usually made to store the substrates with as little distance between one another as possible.

In spite of the fact that the distance is as little between one another as possible, it is often necessary to be able to remove specific individual wafers from the storage device, without removing other substrates in this case. Therefore, the distance between consecutive substrates within such storage devices is limited by an access distance still being present, into which a gripper can be inserted in order to detect and to remove the corresponding substrate.

In order to be able to optimize processing processes, so-called test wafers are used. No electronic components are usually manufactured from such test wafers. They are only used to empirically optimize process parameters, by processing test wafers with different process parameters, and by determining, based on measurements, which values of the process parameters will be used in the wafers that will actually be processed. Apart from the wafers mentioned, test wafers of this type are also another important field of application for the present invention.

Moreover, it may be necessary to transport wafers in a container inside or even outside of a factory. For this as well, transport containers, which have a plurality of storage elements, on each of which a substrate can usually be arranged, are used. Transport containers of this type are often standardized, for example, as so-called FOUP (front opening unified pod) transport boxes. Also here there is the need to be able to arrange the substrates with as little distance from one another as possible.

SUMMARY OF THE INVENTION

Thus, the object of the present invention is to create a device, with which a plurality of preferably horizontally stored substrates can be stored and optionally transported with as little distance between each other as possible. Moreover, clean room conditions shall also be able to be created within the device in as simple a manner as possible at least in preferred variants. According to another aspect of the present invention, a tool shall be provided, with which substrates can be removed from the device in spite of the fact that the distance between one another is as little as possible. Still another aspect of the present invention pertains to a method for arranging or removing substrates from the device.

The object is accomplished by a device with a plurality of consecutive storage elements in a stacked direction, each of which is provided for accommodating at least one substrate. Each of the storage elements is provided with means for depositing the substrate. The storage elements have a stacking area, which is provided for arranging the respective storage element within a stack of storage elements. It is especially advantageous in this case if the respective distance between a plurality of consecutive storage elements and preferably between all consecutive storage elements can be changed from a storage distance to an access distance that is increased for this purpose. The result of this is that in the stored state, an as short as possible, so-called pitch distance between consecutive storage elements and thus also substrates can be achieved. The storage distance is essentially only limited by a minimum distance, which should be complied with, in order to guarantee that the surfaces of the substrates do not touch. Therefore, very tightly packed storage of wafers or other substrates is possible with the present invention. Nevertheless, the present invention makes possible the advantage of being able to access each substrate contained in the closed storage means separately.

In a preferred embodiment of the present invention, in all of the consecutive storage elements that are present, their distance to one another can be varied for access purposes. Thus, each substrate stored in the device can be accessed separately. The distance is preferably increased in parallel to the stacked direction of the storage elements. Basically, devices according to the present invention can be structurally designed in order to store substrates in a horizontal or in a vertical direction or in any directions between them.

In connection with the present invention, it may be expedient to achieve the relative motion needed for increasing the distance between two consecutive storage elements by the storage elements that is the upper storage element in case of horizontal direction of the substrates being lifted. It may be necessary here to lift some or all of the storage elements located above, depending on the storage distances of the storage elements.

In another embodiment, the increase in the storage distance up to the access distance is achieved by the lower of the two storage elements to be separated from one another being moved downwards. It may also be necessary here to move some or all of the storage elements following the lower of the two storage elements (between which an access distance shall be achieved) likewise downwards.

Finally, in another alternative embodiment, the lower of the two storage elements to be distanced from one another may also be moved downwards and the upper storage element moved upwards. In connection with the present invention a plurality of variants of relative motions are thus conceivable in order to separate storage elements from one another and to make possible access to a storage area of at least one of the storage elements.

A particularly advantageous embodiment according to the present invention can be achieved by means of storage elements that are arranged directly on top of another. The storage elements may be closed in a ring-shaped pattern and have each a plurality of supports on which a substrate each can be arranged. The supports may be, for example, bent upwards against the at least approximately round rings and have contact surfaces for storing a substrate.

Consequently, it is also possible to embody the housing of the device by means of the storage elements themselves. Clean room conditions can be produced and maintained within the housing. An otherwise necessary, additional housing can be avoided by such an embodiment. Furthermore, the problem of an otherwise likewise necessary access opening in the housing and the positioning of the substrates to be removed or to be inserted in front of the access opening can thus be favorably avoided as well. Nevertheless, it may also be expedient, in certain embodiments of the present invention, to arrange the storage elements around a housing, which can be provided with an insertion/removal opening for substrates and/or storage elements.

It is especially preferred here if the storage elements can be inserted or removed from the stack of storage elements separately. Particular advantages can then be achieved if a storage element can be removed or inserted at any point of the stack, without other storage elements having to be moved for this purpose beforehand or thereafter. This may, for example, be used for replacing a storage element with another storage element, transporting a substrate together with its storage element, or even for reducing or enlarging a stack. Consequently, the storage capacity may also be adapted to the respective conditions with very little effort. To achieve this, it may be expedient if the storage elements can be stacked on top of one another, without their having a detachable or undetachable connection to one another.

With such a solution, there is also the possibility of removing a substrate together with its storage element from the stack and transporting it within a processing plant or a factory. Consequently, the number of necessary contacts between handling means and the respective substrate itself can be considerably reduced. Contacts of this type always hold the risk that the respective substrate is damaged.

To seal the housing in the outward direction, storage rings may be provided with sealing elements, which then seal a possible gap between the storage elements, if these take up the provided storage distance from one another. The advantageous encapsulation of the device against the outside that can be achieved as a result can also be achieved by means of other sealants.

The tower or stack formed by means of a plurality of superimposed storage elements can be prone to instability, especially when an access distance is formed between two storage elements. In order to avoid this, the device may be provided with stabilizing elements. Such stabilizing elements may be, for example, centering elements, which are attached at the storage elements and accurately align the storage elements in relation to one another. Lateral guide elements, which are arranged on the outside next to the storage elements and which prevent a tipping over of the tower, are another possibility.

According to another aspect of the present invention, a transport device may also be embodied with it, with which a plurality of substrates can be transported simultaneously to a relatively small space. Because of the properties of the present invention already mentioned, it is possible to produce, with such transport devices according to the present invention, transport containers which are markedly more compact than the currently usual FOUP boxes already mentioned in the introduction, with the same transport capacity.

The extremely highly compressed storage of the substrates that can be achieved with the present invention is particularly advantageous in connection with transport devices, which are provided for transport outside of a factory since the costs and the technical effort for a transport increase with the size of the transport container. However, the use of such compact transport boxes or those transport boxes that have a markedly higher accommodation capacity for substrates with the same dimensions as up to now may also be highly advantageous within a factory. In this connection, a transport container, in which only one storage element with its substrate can be accommodated, may also be advantageous. A storage element according to the present invention may or may not be provided with transport containers for transport within a factory on a conveyor belt or another conveying means.

The present invention is explained in greater detail based on the exemplary embodiments shown purely schematically in the figures. The various features of novelty which characterize the invention are pointed out with particularity in the claims annexed to and forming a part of this disclosure. For a better understanding of the invention, its operating advantages and specific objects attained by its uses, reference is made to the accompanying drawings and descriptive matter in which preferred embodiments of the invention are illustrated.

BRIEF DESCRIPTION OF THE DRAWINGS

In the drawings:

FIG. 5a is a view showing a state in a sequence of the opening of the device for removal or for insertion of a wafer;

FIG. 5b is a view showing another state in a sequence of the opening of the device for removal or for insertion of a wafer;

FIG. 5c is a view showing another state in a sequence of the opening of the device for removal or for insertion of a wafer;

FIG. 5d is a view showing another state in a sequence of the opening of the device for removal or for insertion of a wafer;

FIG. 6 is a schematic flow chart with elements of the device according to the present invention and a tool according to the present invention;

FIG. 7 is an overall view of a storage device according to a preferred embodiment of the present invention;

FIG. 8 is a detail view of the device according to the present invention according to the exemplary embodiment according to FIG. 7;

FIG. 9 is a perspective detail view according to FIG. 8;

FIG. 10 is a top view of the installed device according to FIG. 7;

FIG. 28 is a perspective view of another exemplary embodiment of the device according to the present invention;

FIG. 29 is a stack from FIG. 29 with storage elements according to the present invention;

DESCRIPTION OF THE PREFERRED EMBODIMENTS

Figure 1:
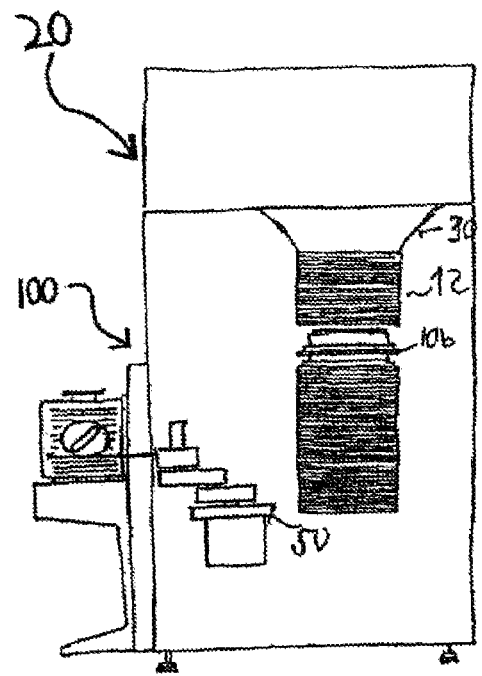
FIG. 1 is a lateral view of a device according to the present invention.

Referring to the drawings in particular, in a device designated by 100 as a whole in FIG. 1 is arranged a stack 12 of storage elements 10, which lies at the bottom (not shown). With the exception of the lowermost storage ring, each of the storage rings 10 stands with a stacking area directly on the respective storage ring 10 arranged below it. From above, a clean air flow directed downwards passes through the stack 12 from a clean air unit 20 such that a clean room is formed in the closed state. In the open state shown, the clean air flow is used to maintain a dust- and particle-free environment within the device.

Figure 19:
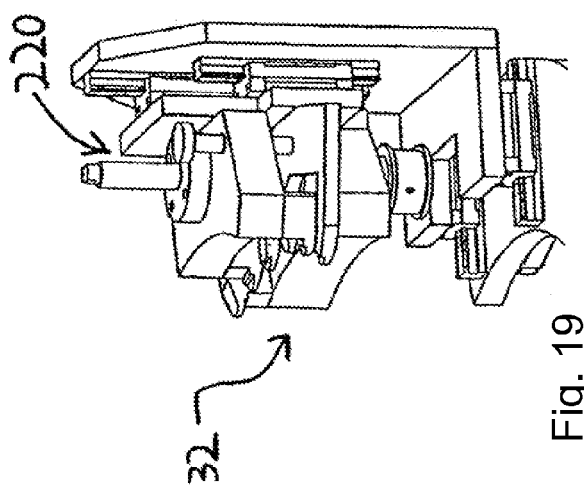
FIG. 19 is a view of a state of a sequence of lifting the upper storage rings, releasing the storage ring to be processed and holding down the storage rings lying below same with the tool (without showing the storage rings in each case)
Figure 22:
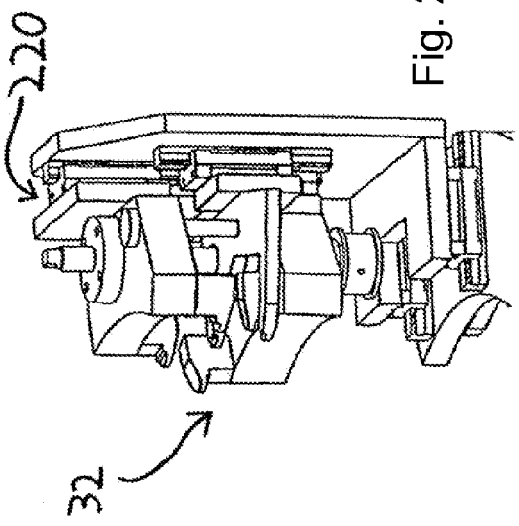
FIG. 22 is a view of another state of a sequence of lifting the upper storage rings, releasing the storage ring to be processed and holding down the storage rings lying below same with the tool (without showing the storage rings in each case)
Figure 23:
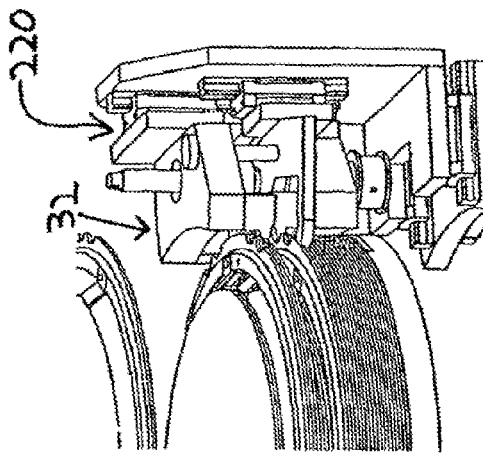
FIG. 23 is a view showing a state in the process of lifting the upper storage rings, releasing the storage ring to be processed and holding down the storage rings lying below same with the tool (without showing the storage rings in each case)
Figure 24:
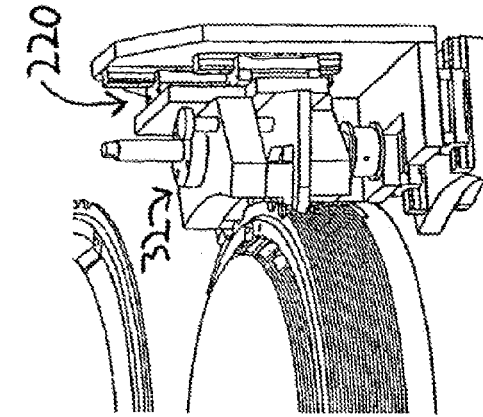
FIG. 24 is a view showing another state in the process of lifting the upper storage rings, releasing the storage ring to be processed and holding down the storage rings lying below same with the tool (without showing the storage rings in each case)
Figure 25:
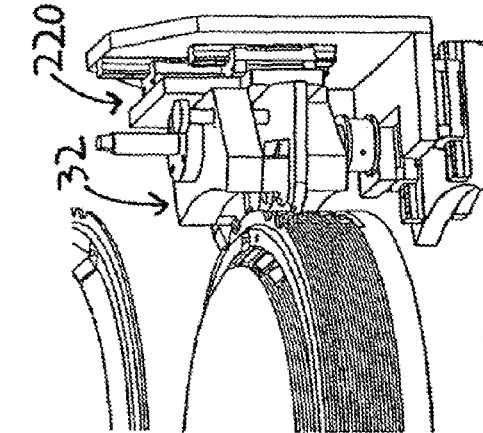
FIG. 25 is a view showing another state in the process of lifting the upper storage rings, releasing the storage ring to be processed and holding down the storage rings lying below same with the tool (without showing the storage rings in each case)
Figure 26:
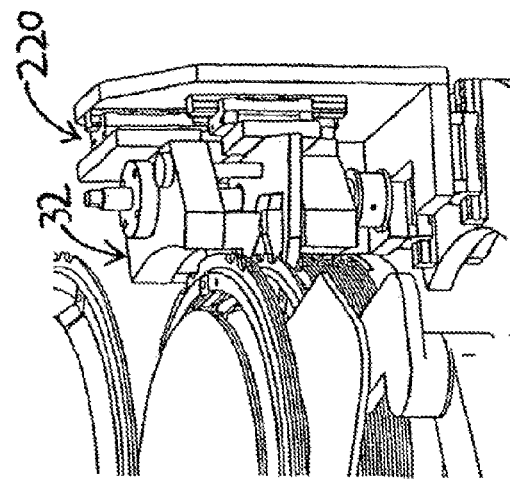
FIG. 26 is a view showing another state in the process of lifting the upper storage rings, releasing the storage ring to be processed and holding down the storage rings lying below same with the tool (without showing the storage rings in each case)
Figure 27:
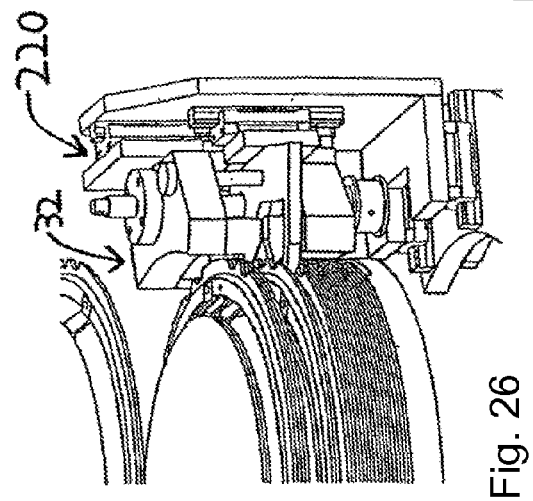
FIG. 27 is a view showing another state in the process of lifting the upper storage rings, releasing the storage ring to be processed and holding down the storage rings lying below same with the tool (without showing the storage rings in each case)

A handling means 32 (see FIG. 19), with which the stack of storage rings can be opened in a selective manner, can be controlled via a control panel 30. In the exemplary embodiment shown here, this happens by means of a tool 50 coordinated with the device.

Figure 3:
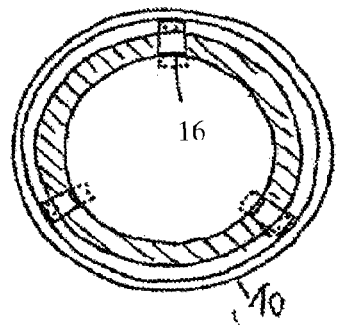
FIG. 3 is a detailed top view from FIG. 1.

As shown in FIG. 3 three holding elements 16 (supports), on which a disk-shaped wafer 40 can be stored, are arranged in the storage rings 10. The holding elements 16 are bent slightly upwards and point inwards (in relation to the storage rings). Each of them has a flat, downwards sloping contact surface and thus forms a storage site for a wafer 40.

Figure 2:
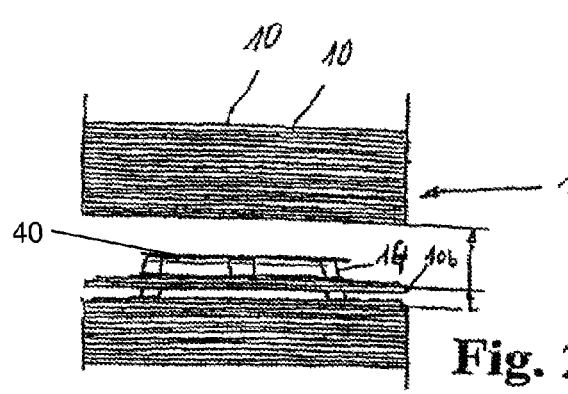
FIG. 2 is a detail view from FIG. 1.
Figure 4:
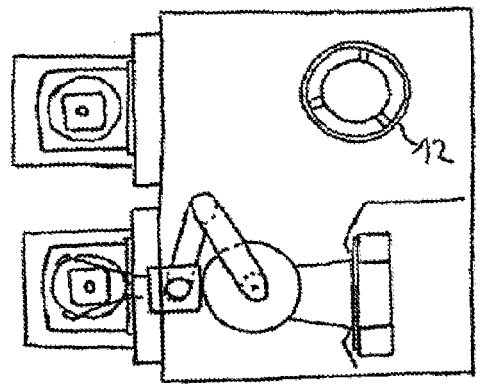
FIG. 4 is a top view of the device according to FIG. 1.
Figure 13:
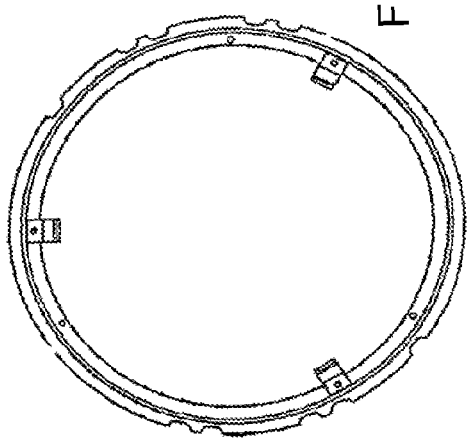
FIG. 13 is a top view of the storage ring according to FIG. 12.
Figure 14:
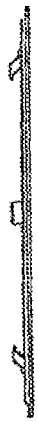
FIG. 14 is a lateral view of the storage ring according to FIG. 12.
Figure 15:
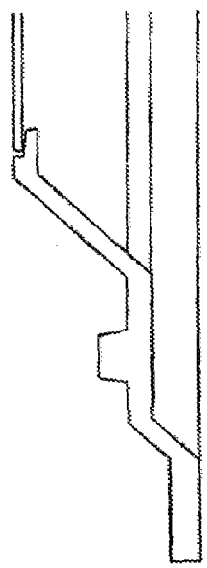
FIG. 15 is a detail view according to FIG. 14 with deposited wafer.
Figure 12:
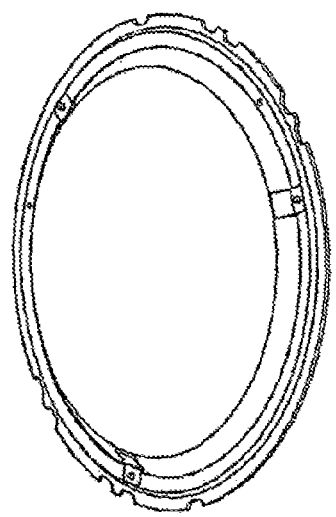
FIG. 12 is a perspective view of a storage ring according to the exemplary embodiment according to FIG. 7.
Figure 11:
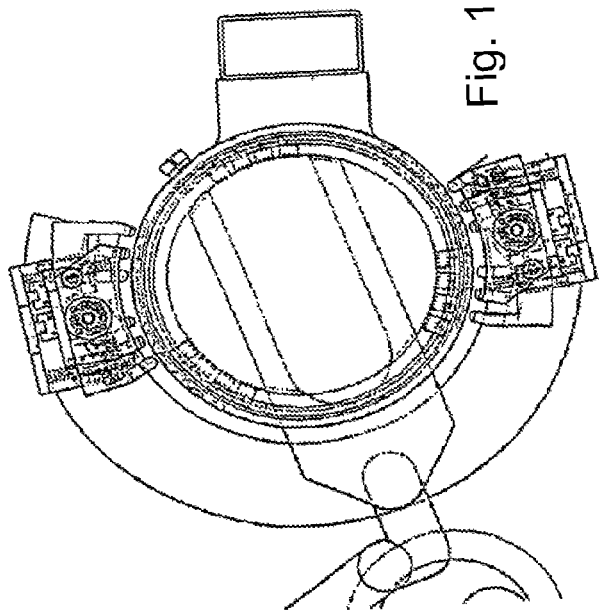
FIG. 11 is a detail view according to FIG. 10.
Figure 17:
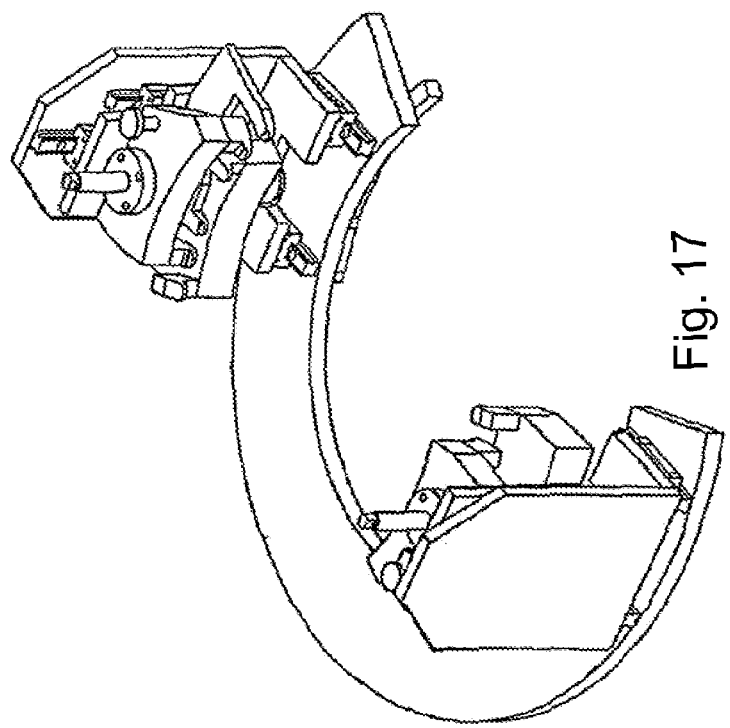
FIG. 17 is a perspective view according to FIG. 16.
Figure 18:
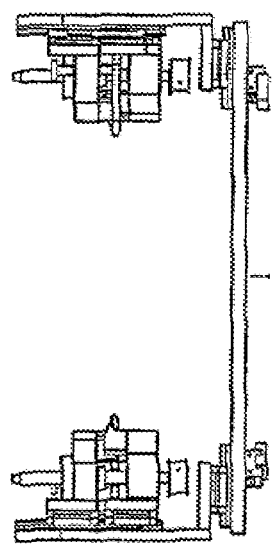
FIG. 18 is a lateral view according to FIG. 16.
Figure 16:
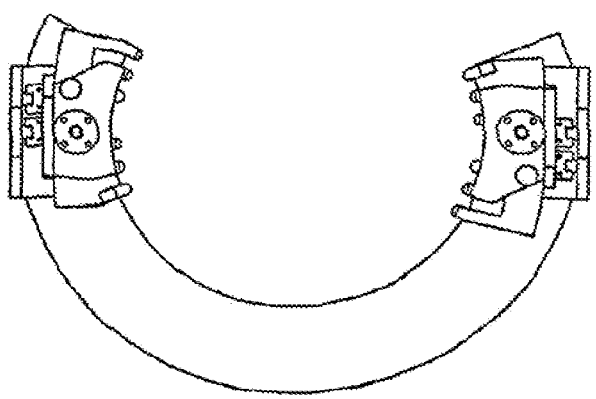
FIG. 16 is a top view of the guide elements according to the embodiment according to FIG. 7.
Figure 20:
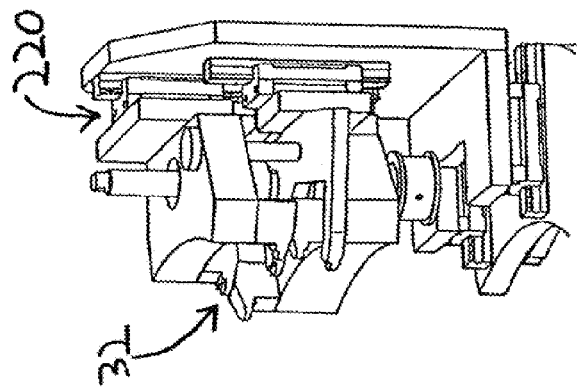
FIG. 20 is a view of another state of a sequence of lifting the upper storage rings, releasing the storage ring to be processed and holding down the storage rings lying below same with the tool (without showing the storage rings in each case)
Figure 21:
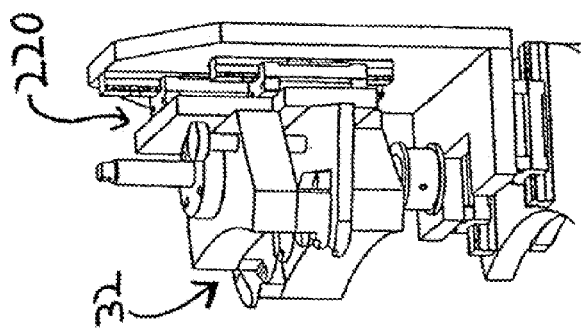
FIG. 21 is a view of another state of a sequence of lifting the upper storage rings, releasing the storage ring to be processed and holding down the storage rings lying below same with the tool (without showing the storage rings in each case)

FIG. 2 shows the open state of the storage rings 10. Here, all storage rings are lifted upwards by a defined amount above those storage rings, on which an access is intended. Consequently, an access space is formed. However, the storage rings 10, and thus also the wafers, are tightly packed in such a manner that the wafer in question still cannot be grasped from below at any rate, since this wafer has a very small distance to the next lower wafer. For this reason, the next storage ring downwards on the lifted partial stack 12' is—subsequently or simultaneously—also lifted by a defined amount. This lifting height may correspond, for example, to the height, with which the wafers 40 are moved through the bent holding elements 16 upwards by the ring-shaped part of the storage ring. In spite of the great packing density in the storage state of the device, each wafer is readily accessible due to this measure. As is shown in FIG. 4, the corresponding wafer 40 can be fed after its removal to a further handling procedure or process by means of an automatic handling machine.

FIGS. 5a through 5d show the above-described opening procedure in detail. The tool 50, which has two lifting surfaces 52 and 54, is moved at a certain azimuthal position towards the stack 12 of storage rings and then grips under the storage ring 10a with the upper lifting surface. The storage ring 10a is then moved upwards by a certain path until the lower lifting surface touches the storage ring 10b. The lower storage ring 10b is then lifted by a certain path in turn, whereby all the storage rings lying above it are lifted further with it. In this position, the wafer that lies on the storage ring 10b can be accessed, free from elements of the device or other wafers, as this is evident from FIG. 5d. Thus, this wafer can now be removed by means of the gripper 60 (see FIG. 9). In principle, it is possible to proceed in the same manner for inserting a wafer into the device and for depositing it on the storage ring 10b in relation to the formation of an access space for the storage ring 10b.

In the embodiment shown, the tool 50 can be rotated around the stack 12 of storage elements 10 in order to be able to adopt any random position on the circumference of the stack. It is also possible, however, in another embodiment for the stack 12 to be rotated or moved in another manner and for the tool to be fixed in relation to its position on the circumference or only to be rotatable by a small pivot angle.

In the embodiment according to the present invention shown here, the stack 12 of storage rings 10 is stabilized by its position being held on the outside by means of three vertical rods (not shown here in detail). This prevents a tipping over of the stack 12. As an alternative to this, at least one guide pin may be guided vertically through the storage elements.

As is shown in FIG. 6, the projections 14 are offset against one another in a stair-like manner at the storage rings 10, so that each of the projections of the higher storage ring is offset, for example, in a clockwise manner—azimuthally (in the circumferential direction) by somewhat more than the width of the projection. The measure is in conjunction with the embodiment of the tool 50 of this exemplary embodiment, in which the lower lifting surface 52 is offset to the left by somewhat more than one projection width compared to the upper lifting surface 54.

In a preferred embodiment according to FIGS. 7-27, the lateral guides are arranged, such that meshing with the stack is made possible not only for removing and re-inserting wafers 40, but also for replacing storage rings 10. To this end, guide elements 80, which lie far from one another and which allow a horizontal extracting of the storage rings 10, are arranged on both sides of the storage rings 10. These guide elements 80 are provided with rolling or sliding elements in the exemplary embodiment. With such a device, it is possible for maintenance work to be able to be performed on same even during the operation of the plant, without the entire plant having to be shut down. Said maintenance work may consist of, e.g., replacing or removing storage elements or providing the stack with additional storage elements.

In this exemplary embodiment, use is made of the already mentioned expansion solution. In this case, the tool of the device meshes with three storage rings in each case, i.e., even with the storage ring 10c, which is arranged below the storage ring 10b. This storage ring 10c is held at its level, so that the tension—e.g., generated by the pressure of the arrangement—cannot, when released, lead to an automatic lifting of the storage rings remaining at the bottom.

Finally, embodiments according to the present invention are also possible, in which the substrates are not stored in such a manner or not at all compressed on storage elements, for example, in the so-called "1/1 pitch" provided as a standard. Consequently, access to a substrate may be possible without changing the distance to one or more adjacent storage elements. Nevertheless, the above-described expanding may also be quite meaningful in such an arrangement for preventing the automatic lifting of the storage elements lying at the bottom.

To be able to vary the degree of compression in a particularly simple manner, an intermediate ring (not shown in the figures), against which both respective storage rings lie, can be arranged between two consecutive storage rings. The distance of the consecutive substrates within the storage device can be varied [sic, "varriert" is an obvious typo for "variiert"—Tr.Ed.] over the height of the storage rings. In spite of this variation possibility, the same storage elements may always be used. This possible embodiment according to the present invention also demonstrates that, in connection with the present invention, the storage elements do not absolutely have to follow one another directly.

In the embodiment according to the present invention shown in FIG. 28, a plurality of stacks 12 of storage rings 10 are provided. In the view shown in FIG. 28, the individual storage rings are not shown as such, but only their entirety in the form of the respective stack 12. An upper cover plate 110, which can rest, for example, on the topmost storage ring, is arranged on each stack 12 (see also FIG. 29). Moreover, each of the stacks 12 may be arranged with its respective lower storage ring on a lower bottom plate 111. The storage elements as well as the bottom plate 111 and the cover plate 110 form an all in all, essentially closed container.

Each of the bottom plates 111 is fastened at an axle which can be conveyed in the Z direction (e.g., vertically), as a result of which all storage rings 10 can be conveyed directly between two stationary arms 112 in the Z direction. Each of the two arms 112 contains opening tools 114 (explained below in detail), with which the respective stack 12 can be opened at any random point for access to a specific substrate or a specific storage ring 10. In another embodiment, the opening tools can be conveyed and at least one stack is arranged in a stationary manner.

Figure 30:
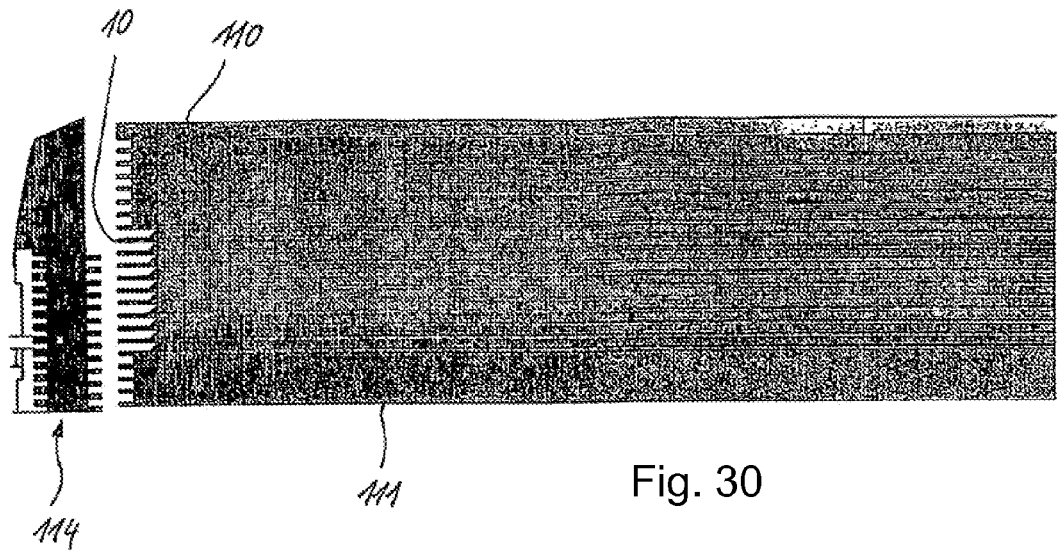
FIG. 30 is a view showing a state during a separation of storage elements for access.
Figure 31:
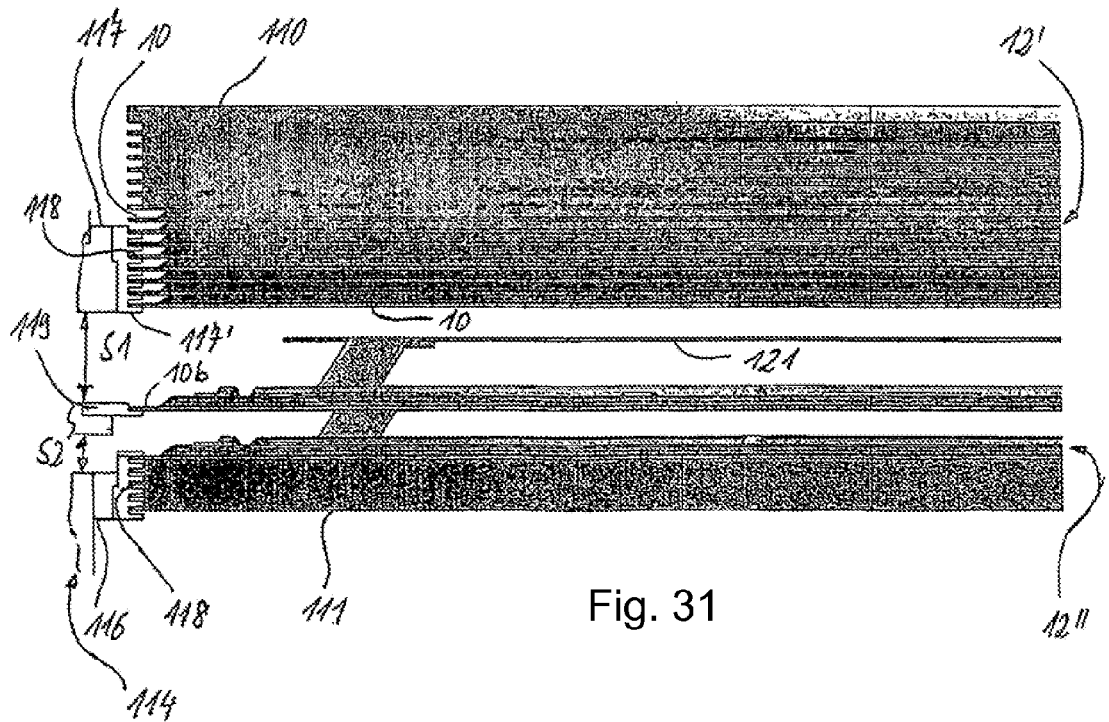
FIG. 31 is a view showing a different state during a separation of storage elements for access.

The two opening tools, each one of which is arranged in one of the two arms 112 which is pivotable in parallel to the plane of the wafers, are explained in detail on the basis of FIGS. 30 and 31. As is especially evident from FIG. 31, each opening tool 114 has a lower and an upper gripping part 116, 117. The upper gripping part 117 is embodied here with a plurality of superimposed gripping elements 117'. Consecutive gripping elements 117' form between themselves a groove 118, whose width is greater than the height of the storage rings 10 (likewise shown in a perspective sectional view in FIG. 32) in the area of their outer circumference. Since the distance between consecutive grooves 118 corresponds to the distance between consecutive storage rings 10, a storage ring with a section of its circumferential area can be arranged in each groove 118.

The lower gripping part 116 is, in principle, embodied in the same manner, while a middle gripping part 119 has only a stepped contact surface.

If a specific storage ring 10 shall now be able to be accessed for removing or inserting a wafer, then at first all stacks 12 (FIG. 28) are conveyed together in the Z direction. Consequently, the storage ring 10b intended for access is brought, in the Z direction, to the same position, in which the middle gripping part 119 is also located. Subsequently, the two arms 112 can be pivoted onto the stack 12, so that the storage ring 10b with a section of circumference is located directly above the contact surface of the middle gripping part 119. Storage rings following this storage ring 10b upwards are arranged in the grooves of the upper gripping part, while the storage rings 10 following downwards are located in grooves of the lower gripping part 116.

If a storage ring 10 shall be accessed, which is located in the area of the bottom plate 111, then the bottom plate itself may also be arranged with its bars in the lower gripping part 116 as this is shown in FIG. 31. The same applies to the upper gripping part 117 and the cover plate 112, which is also provided with corresponding bars on its circumference.

To produce an access distance between two consecutive storage rings, the relative motion needed for this may be made only in the stack, only in the opening tool or a partial motion each both in the stack and in the opening tool. In one of these possible embodiments, the upper gripping part 117 is moved upwards in the Z direction by a predetermined small path S1 and the lower gripping part 116 is lowered downwards by a likewise predetermined path S2. The amount of the path S1 may be greater here than the amount of the path S2. The middle gripping part 119 may, by contrast, remain in its original Z position. As a result of this, a situation appears, as is shown in FIG. 31. For handling by means of an automatic handling machine, the wafer to be removed now has both a sufficient distance to the next higher storage ring 10 and to the next lower wafer. The next lower wafer may now be located approximately in the plane of the storage ring 10b, whose wafer is being accessed.

Since essentially only a relative motion is made between the storage ring 10b to be released and the storage ring arranged above it—and/or optionally also the one arranged below it—for the release or separation of storage rings 10 and their wafers, other possible motion distributions are explained below. The relative motion(s) may, of course, be produced in different ways than those shown here.

Thus, it is possible, for example, that the partial stack 12', which is arranged above the storage ring 10b, which shall be accessed (upper partial stack) during the separation procedure, is only held in its current Z position. The distance to the upper partial stack 12' is produced by a conveying motion, directed downwards in the Z direction, of the middle gripping part 119—and thus also of the storage ring 10b—as well as of the lower partial stack 12" arranged below it. The movement of the middle gripping part 119 can be stopped, for example, by its abutting against a stop. On the other hand, the lower partial stack 12" arranged below the storage ring 10b can continue this motion by means of the lower gripping part 116 until the lower gripping part 116 also abuts against a stop or otherwise stops its motion. Consequently, there is also enough space below the substrate 121 arranged on the storage ring 10b to drive a gripper in between the substrate 121 and the storage ring 10b.

In another embodiment, the upper partial stack 12' is in turn held in a fixed position in its Z position by means of the upper gripping part 117. The access space, in which, for example, the bottom plate 111 is moved downwards, is created by means of a movement of the remaining storage elements 10 directed downwards in the Z direction. By means of a different limitation of the paths of motion of the storage ring and of the lower partial stack, a distance may also be produced between these.

All motions directed downwards or upwards in the Z direction can be completely or partially carried out by means of utilizing the force of gravity and/or by means of drive means 220, such as, for example, hydraulic, pneumatic, electric and spring-elastic drive means. Drive means of these types also make possible a functionally safe closing of the storage device after one of the storage elements has been accessed.

Figure 32:
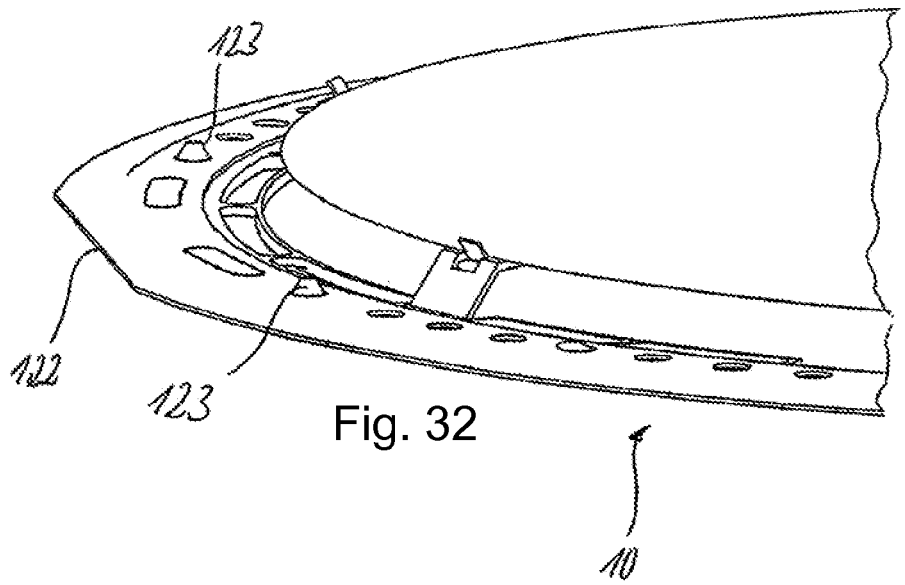
FIG. 32 is a perspective view of a stack in a state of access.
Figure 33:
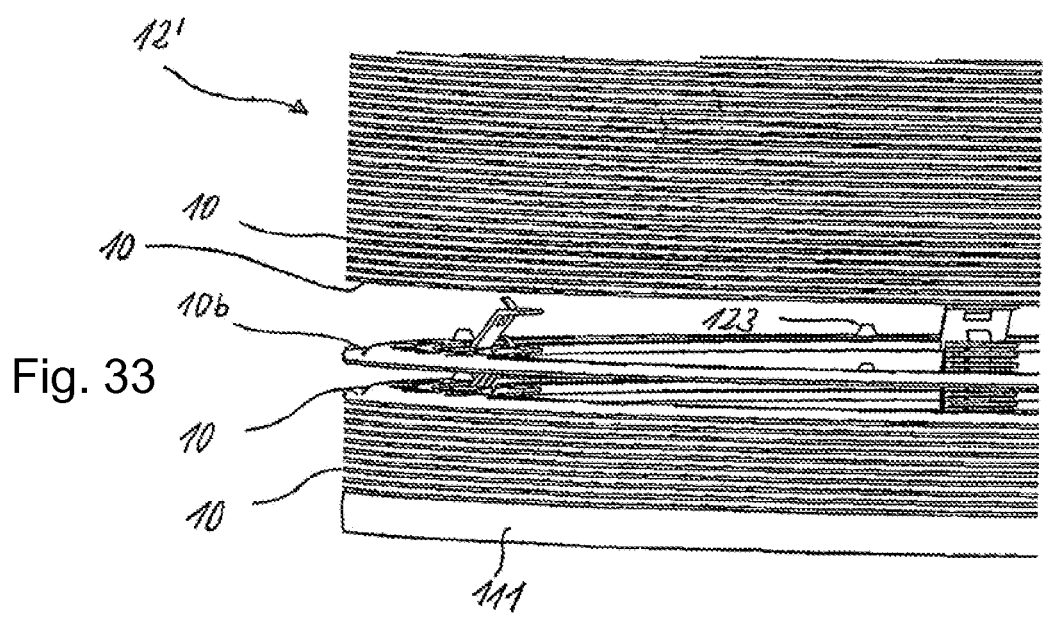
FIG. 33 is a perspective detail view of a storage ring with a wafer arranged on it.

Further details of the storage rings 10 which are preferably used in connection with these exemplary embodiments according to the present invention are evident from FIGS. 32 and 33. Accordingly, the storage rings are only approximately circular. Rather, they have four sections 122 offset by 90° to one another and running essentially in a straight line. Because of running in a straight line, it is possible to arrange these sections with a greater contact surface in the grooves of the gripping parts or on their contact surfaces.

Moreover, the storage rings have a plurality of centering domes 123, which are used for being able to stack the storage rings 10 on top of one another as accurately as possible. The centering domes 123 in this case mesh with the respective centering domes 123 of an adjacent storage ring 10 in the stacked direction. Due to the centering domes 123, means can be avoided, which would otherwise be necessary in addition to the storage rings for their exact alignment with one another or in relation to the bottom plate 111.

As this is indicated in FIG. 29, clean room conditions can be produced within the storage container which is composed of at least the storage rings 10, the lower bottom plate 111, as well as the cover plate 110. The herefor intended means for producing clean room conditions are not shown in detail. An atmosphere that is under high pressure compared to the environment, for example, a nitrogen or ultraclean air atmosphere, can be created in the interior of the storage container with these means. A targeted discharge of the respective gas from the interior of the storage container can be achieved with predetermined leaks of the storage container, and the penetration of particles from outside into the interior of the container can be prevented. These leaks can be achieved, for example, by means of omitting a seal or by means of an incomplete seal between the storage rings.

Figure 34:
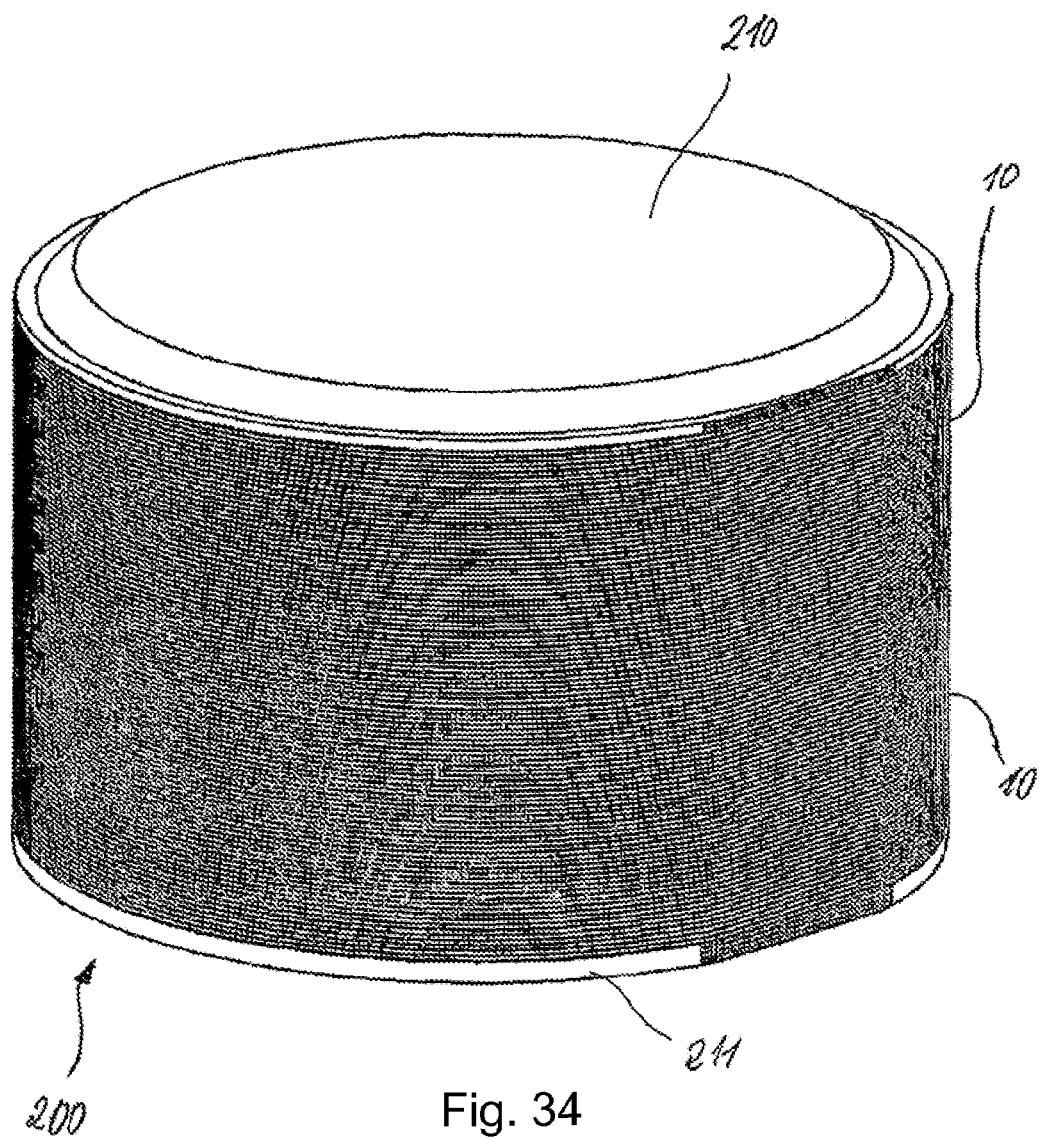
FIG. 34 is a view of a transport container according to the present invention.

FIG. 34 shows a transport container 200 according to the present invention, which is composed of storage rings 10 arranged superimposed and directly on top of one another, a bottom plate 211 and a cover plate 210. Since the storage rings in turn have sealing elements (not shown), together with the cover plate and the bottom plate, they form a sealed transport container 200 for substrates. The transport container 200 can be secured against accidental opening with locking means, for example, two clamps (not shown in detail), each of which grips around both the cover plate 210 and the bottom plate 211. In advantageous variants of the present invention, consecutive storage rings 10 can be coupled with one another in ways not shown in detail. Consequently, an increase in distance between storage elements 10 can be achieved in a particularly simple manner and at the same time a cohesion between the storage elements can be achieved. Such a coupling may be, for example, a type of scissors-like coupling.

In a variant of the present invention, provisions may also be made for the transport container 200 shown to be inserted into an external sealable transport box. In this case, the sealing against external effects may take place by means of the external transport box.

While specific embodiments of the invention have been shown and described in detail to illustrate the application of the principles of the invention, it will be understood that the invention may be embodied otherwise without departing from such principles.

The invention claimed is:

1. A device for storing plate-shaped substrates the device comprising:
   a plurality of consecutive storage elements stacked in a stacked direction, each storage element accommodating at least one substrate, each of said storage elements comprising an outer ring-shaped stacking area and a plurality of holding elements connected to said outer ring-shaped stacking area, each of said holding elements extending from said outer ring-shaped stacking area in an upwardly and radially inward direction with respect to said outer ring-shaped stacking area, said plurality of holding elements being offset from said ring-shaped stacking area with respect to said stacked direction, said at least one substrate being arranged on said plurality of holding elements, the inner diameter of the ring shaped stacking area being greater than the diameter of said substrate;
   a tool for selectively opening the stack of storage rings, having a first storage element contact surface and a second storage element contact surface, said first storage element contact surface engaging a first storage element;
   a moving means for moving said tool relative to said stacked storage elements;
   a moving means for moving said tool relative to said stacked storage elements;
   a control unit programmed for moving said tool via said moving means with said first storage element contact surface engaged with said first storage element such that said second storage element contact surface engages a second storage element adjacent said first storage element, wherein said control unit controls said moving means such that said tool divides said plurality of stacked storage elements into an upper stack of storage elements and a lower stack of storage elements, said first storage element being located at a spaced location from said second storage element when said second storage element contact surface contacts said second storage element, said control unit controlling said moving means such that said moving means moves said tool with said first storage element contact surface engaged with said first storage element and with said second storage element contact surface engaged with said second storage element such that said second storage element is located at a spaced location from said upper stack of storage elements and said lower stack of said storage elements, to enable access a single said substrate in the stack of the storage elements; and a stacking area defined by an area of one storage element in contact with another storage element in a stacked formation.

2. A device in accordance with claim 1, wherein the storage elements are stacked directly on one another.

3. A device in accordance with claim 1, wherein the storage elements are handled at their stacking area for producing an increased distance between two consecutive storage elements, whereby one of the storage elements is accessible for a deposit or a removal of said substrate.

4. A device in accordance with claim 1, wherein said moving means moves said tool such that a distance between one storage element and another storage element is increased.

5. A device in accordance with claim 1, wherein the storage elements are self-contained storage rings.

6. A device in accordance with claim 1, wherein the plurality of holding elements engage said substrate such that said substrate is deposited above a ring section of the storage element.

7. A device in accordance with claim 6, wherein the projections have a horizontally directed contact surface.

8. A device in accordance with claim 1, wherein storage elements arranged on top of one another form an at least laterally enclosed space.

9. A device in accordance with claim 8, further comprising means for producing clean air such that a clean room atmosphere is produced in the enclosed space.

10. A device in accordance with claim 9, wherein said means for producing clean air creates an overpressure in an interior of the device.

11. A device in accordance with claim 8, further comprising means for discharging a predetermined amount of gas from within an interior of the device in an outwards direction.

12. A device in accordance with claim 1, further comprising means for increasing stability and/or positioning accuracy of superimposed storage elements.

13. A device in accordance with claim 12, further comprising a centering means formed on one of the storage elements, which centering means cooperates with a centering means of a consecutive storage element in the stacked direction for increasing the stability.

14. A device in accordance with claim 1, wherein the two contact surfaces of the tool are offset against one another in the stacked direction of the storage elements.

15. A device in accordance with claim 1, wherein the tool is movable in a plane parallel to surfaces of the substrates.

16. A device in accordance with claim 1, wherein a pitch of said upper stack of storage elements and said lower stack of storage elements is not changed when said tool releases one of said storage elements.

17. A device in accordance with claim 1, further comprising a sealing means for pressing one storage element against another storage element such that said storage elements are sealed.

18. A device in accordance with claim 1, further comprising a means for discharging nitrogen into the device.

19. A device in accordance with claim 18, further comprising a cover plate and a lower bottom plate, said cover plate and said lower bottom plate defining a space in which said plurality of storage elements are located, said sealing means, said cover plate, said lower bottom plate and said nitrogen providing clean room conditions within said space.

20. A device in accordance with claim 1, wherein said outer ring-shaped stacking area has an outer peripheral edge, each of said storage elements having a projection extending from said outer peripheral edge in a radial outward direction with respect to said outer ring-shaped stacking area, said projection of one of said storage elements being offset from said projection of another one of said storage elements.

21. A device for storing plate-shaped substrates the device comprising:

a plurality of consecutive storage elements stacked in a stacked direction, each storage element accommodating at least one substrate, each of said storage elements comprising an outer ring-shaped stacking area and a plurality of holding elements connected to said outer ring-shaped stacking area, said stacking area having an upper stacking area surface and a bottom stacking area surface, each of said holding elements extending from said outer ring-shaped stacking area in an upwardly and radially inward direction with respect to said outer ring-shaped stacking area, said plurality of holding elements being offset from said ring-shaped stacking area with respect to said stacked direction, said at least one substrate being arranged on said plurality of holding elements, the inner diameter of the ring shaped stacking area being greater than the diameter of said substrate, said upper stacking area surface of one storage element engaging said bottom stacking area surface of an adjacent storage element;

a tool for selectively opening the stack of storage rings, having a first storage element contact surface and a second storage element contact surface, said first storage element contact surface engaging a first storage element;

a moving means for moving said tool relative to said stacked storage elements;

a control unit programmed for moving said tool via said moving means with said first storage element contact surface engaged with said first storage element such that said second storage element contact surface engages a second storage element adjacent said first storage element, wherein said control unit controls said moving means such that said tool divides said plurality of stacked storage elements into an upper stack of storage elements and a lower stack of storage elements, said first storage element being located at a spaced location from said second storage element when said second storage element contact surface contacts said second storage element, said control unit controlling said moving means such that said moving means moves said tool with said first storage element contact surface engaged with said first storage element and with said second storage element contact surface engaged with said second storage element such that said second storage element is located at a spaced location from said upper stack of storage elements and said lower stack of said storage elements to enable access a single said substrate in the stack of the storage elements; and a stacking area defined by an area of one storage element in contact with another storage element in a stacked formation.

22. A device in accordance with claim 21, wherein said outer ring-shaped stacking area has an outer peripheral edge, each of said storage elements having a projection extending from said outer peripheral edge in a radial outward direction with respect to said outer ring-shaped stacking area, said projection of one of said storage elements being offset from said projection of another one of said storage elements.

* * * * *